United States Patent
Yendluri et al.

(10) Patent No.: US 10,432,210 B1
(45) Date of Patent: Oct. 1, 2019

(54) OVERSAMPLED CONTINUOUS-TIME PIPELINE ADC WITH DIGITAL SIGNAL RECONSTRUCTION

(71) Applicant: Analog Devices Global Unlimited Company, Hamilton (BM)

(72) Inventors: Shanthi Pavan Yendluri, Chennai (IN); Donald W. Paterson, Winchester, MA (US); Victor Kozlov, Toronto (CA); Hajime Shibata, Toronto (CA)

(73) Assignee: ANALOG DEVICES GLOBAL UNLIMITED COMPANY, Hamilton (BM)

( * ) Notice: Subject to any disclaimer, the term of this patent is extended or adjusted under 35 U.S.C. 154(b) by 0 days.

(21) Appl. No.: 16/028,002

(22) Filed: Jul. 5, 2018

(51) Int. Cl.
| H03M 1/16 | (2006.01) |
| H03M 1/12 | (2006.01) |
| H03M 1/46 | (2006.01) |
| H03M 1/14 | (2006.01) |

(52) U.S. Cl.
CPC ......... *H03M 1/164* (2013.01); *H03M 1/1245* (2013.01); *H03M 1/145* (2013.01); *H03M 1/167* (2013.01); *H03M 1/466* (2013.01)

(58) Field of Classification Search
None
See application file for complete search history.

(56) References Cited

U.S. PATENT DOCUMENTS

| 6,861,969 B1* | 3/2005 | Ali | H03M 1/0626 |
| | | | 341/155 |
| 8,896,475 B2 | 11/2014 | Shibata | |
| 2005/0275577 A1* | 12/2005 | Bjornsen | H03M 3/46 |
| | | | 341/155 |
| 2006/0022854 A1* | 2/2006 | Bjornsen | H03M 1/0641 |
| | | | 341/120 |
| 2012/0086590 A1* | 4/2012 | Satarzadeh | H03M 3/38 |
| | | | 341/120 |

OTHER PUBLICATIONS

Hajime Shibata et al., *A 9-GS/s 1.125 GHz BW Oversampling Continuous-Time Pipeline ADC Achieving-164-dBFS/Hz NSD*, IEEE Journal of Solid-State Circuits, vol. 52, No. 12, Dec. 2017, 16 pages.

* cited by examiner

*Primary Examiner* — Howard Williams
(74) *Attorney, Agent, or Firm* — Patent Capital Group

(57) ABSTRACT

Continuous-time pipeline analog-to-digital converters can achieve excellent performance, and avoid sampling-related artifacts traditionally associated with discrete-time pipeline ADCs. However, the continuous-time circuitry in the ADCs can pose a challenge for digital signal reconstruction, since the transfer characteristics of the continuous-time circuitry are not as well characterized or as simple as their discrete-time counterparts. To achieve perfect digital signal reconstruction, special techniques are used to implement an effective and efficient digital filter that combines the digital output signals from the stages of the CT ADCs.

20 Claims, 9 Drawing Sheets

US 10,432,210 B1

OVERSAMPLED CONTINUOUS-TIME PIPELINE ADC WITH DIGITAL SIGNAL RECONSTRUCTION

TECHNICAL FIELD OF THE DISCLOSURE

The present disclosure relates generally to analog-to-digital converters (ADCs) and, more particularly, to oversampled continuous-time pipeline ADC with digital signal reconstruction.

BACKGROUND

In many electronics applications, an analog input signal is converted to a digital output signal (e.g., for further digital signal processing). For instance, in precision measurement systems, electronics are provided with one or more sensors to make measurements, and these sensors may generate an analog signal. The analog signal would then be provided to an ADC as input to generate a digital output signal for further processing. In another instance, an antenna generates an analog signal based on the electromagnetic waves carrying information/signals in the air. The analog signal generated by the antenna is then provided as input to an ADC to generate a digital output signal for further processing.

ADCs can be found in many places such as broadband communication systems, audio systems, receiver systems, etc. ADCs can translate analog electrical signals representing real-world phenomena, e.g., light, sound, temperature or pressure for data processing purposes. ADCs are used in a broad range of applications including Communications, Energy, Healthcare, Instrumentation and Measurement, Motor and Power Control, Industrial Automation and Aerospace/Defense. Designing an ADC is a non-trivial task because each application may have different needs in speed, performance, power, cost and size. As the applications needing ADCs grow, the need for accurate and reliable conversion performance also grows.

BRIEF DESCRIPTION OF THE DRAWINGS

To provide a more complete understanding of the present disclosure and features and advantages thereof, reference is made to the following description, taken in conjunction with the accompanying figures, wherein like reference numerals represent like parts, in which.

DESCRIPTION OF EXAMPLE EMBODIMENTS OF THE DISCLOSURE

CT pipeline ADCs can achieve excellent performance, and avoid sampling-related artifacts traditionally associated with discrete-time pipeline ADCs. However, the CT circuitry in the ADCs can pose a challenge for digital signal reconstruction, since the transfer characteristics of the CT circuitry are not as well characterized or as simple as their discrete-time counterparts. To achieve perfect digital signal reconstruction, special techniques are used to implement an effective and efficient digital filter that combines the digital output signals from the stages of the CT ADCs.

Designing ADCs

ADCs are electronic devices that convert a continuous physical quantity carried by an analog signal to a digital number that represents the quantity's amplitude (or to a digital signal carrying that digital number). The conversion involves quantization of the analog input signal, so it would introduce a small amount of error. Typically the quantization occurs through periodic sampling of the analog input signal. The result is a sequence of digital values (i.e., a digital signal) that has converted a CT and continuous-amplitude analog input signal to a discrete-time and discrete-amplitude digital signal. An ADC can be defined by the following application requirements: its bandwidth (the range of frequencies of analog signals it can properly convert to a digital signal) and its resolution (the number of discrete levels the maximum analog signal can be divided into and represented in the digital signal). An ADC also has various specifications for quantifying ADC dynamic performance, including signal-to-noise-and-distortion ratio (SINAD), effective number of bits (ENOB), signal to noise ratio (SNR), total harmonic distortion (THD), total harmonic distortion plus noise (THD+N), and spurious free dynamic range (SFDR). ADCs have many different designs, which can be chosen based on the application requirements and performance specifications.

Figure 1:
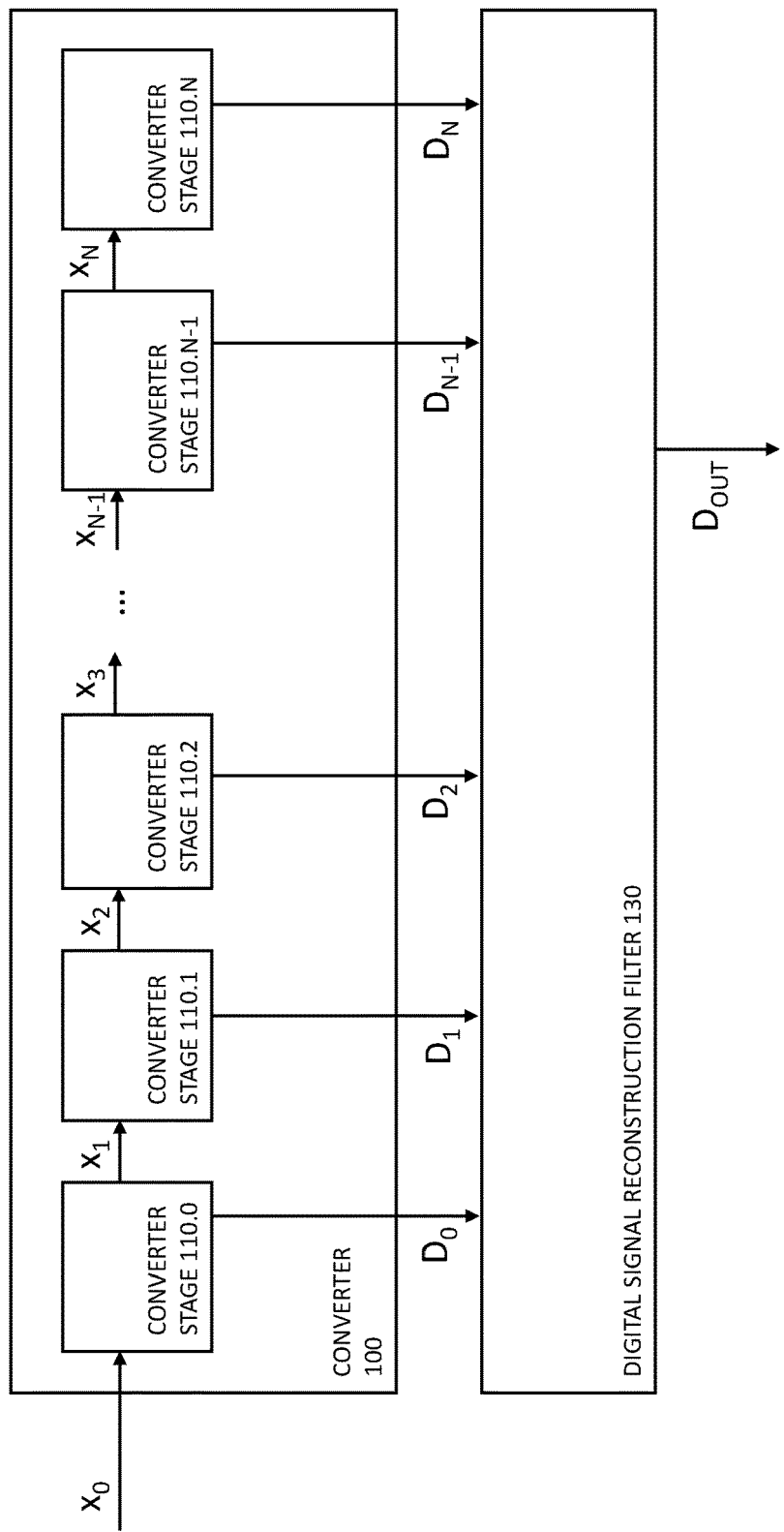
FIG. 1 is an illustrative system diagram of a multi-stage ADC, according to some embodiments of the disclosure.

FIG. 1 is an illustrative system diagram of a multi-stage ADC converter, according to some embodiments of the disclosure. The multi-stage converter 100 includes a plurality of converter stages 110.0-110.N, connected in series, in pipeline, or in cascading configuration. Each converter stage (referred herein as a stage) may receive a respective analog input signal ("$x_0$", "$x_1$", "$x_2$", "$x_3$" ... "$x_{N-1}$", and "$x_N$"), and may generate a respective analog output signal ("$x_1$", "$x_2$", "$x_3$" ... "$x_{N-1}$", and "$x_N$") and a respective digital output signal ("$D_0$", "$D_1$", "$D_2$", "$D_3$" ... "$D_{N-1}$", and "$D_N$"). The respective analog output signals can be residues of the respective converter stages formed by summation/subtraction (e.g., $x_1$ is a residue of converter stage 110.0).

The converter stages can have the same number of bits for digital resolution, or the converter stages can have different numbers of bits for digital resolution. Each converter stage may generate respective digital output signals, which may be combined to form an overall digital output signal $D_{OUT}$ for the multi-stage converter 100. The digital output signals (e.g., "$D_0$", "$D_1$", "$D_2$", "$D_3$" ... "$D_{N-1}$", and "$D_N$") can be provided to a digital signal reconstruction filter 130, which combines and/or filters the respective digital output signals and form the final converter digital output signal $D_{OUT}$ representing the analog input signal $x_0$.

For simplicity, some signal paths may not be shown. For instance, in some cases, one or more converter stages may receive other analog input signals (e.g., analog input signals of the previous stages and/or analog input signals of subsequent stages).

The stages of the multi-stage ADC can be implemented with the same kind of converter architecture, or a combination of different converter architectures. Possible converter architectures include: DS modulation (e.g., as MASH ADCs), Flash conversion (e.g., as in pipeline ADCs), successive approximation register (SAR) conversion, and voltage-controlled-oscillator-based (VCO-based) conversion.

Multi-stage converter 100 can be a CT converter, which means that the converter stages has CT circuitry, and do not use discrete-time (DT) circuitry for conversion, e.g., switched-capacitor circuits. CT ADCs can operate with lower power and achieve better wideband performance than its DT counterparts. CT ADCs can avoid issues traditionally associated with switched-capacitor circuits in DT ADCs. However, CT converters can be more difficult to design. In some cases, the multi-stage converter 100 can be a hybrid CT-DT converter, where one or more stages uses CT circuitry, and one or more stages uses DT circuitry.

CT Pipeline ADC

A CT pipeline ADC based on the architecture shown in FIG. 1 comprises a plurality of CT converter stages, where within a CT converter stage, a fast ADC digitizes the input signal to the CT converter stage to generate the digital output signal of that CT converter stage. The fast ADC can be a Flash ADC comprising a bank of comparators. When there is a subsequent stage, the CT converter stage can reconstruct the input signal using digital-to-analog converter (DAC) to generate a reconstructed input signal, and form a residue for the CT converter stage by subtracting a delayed analog input signal to the stage by the reconstructed input signal. The delayed analog input signal can be formed by a CT delay circuit, where the delay provided by the CT delay circuit matches the delay of the ADC digitizing the input signal and the DAC reconstructing the input signal. The CT delay circuit can be optimized to minimize or reduce the peak of an analog residue waveform. The subtraction of the delayed analog input signal by the reconstructed input signal can be performed using CT circuitry. The subtraction can be performed by the CT circuitry through voltage domain subtraction or current domain subtraction.

Figure 2:
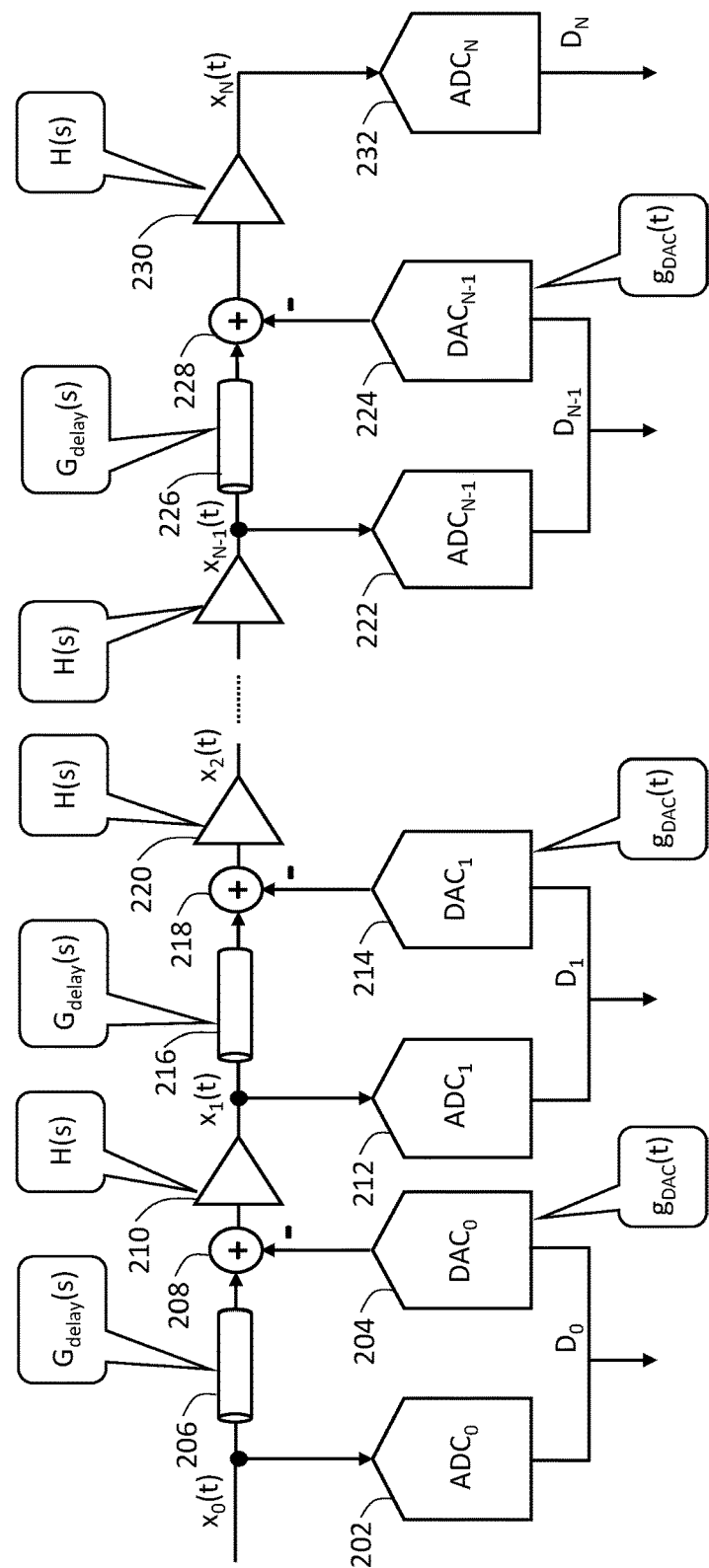
FIG. 2 shows a continuous-time (CT) pipeline ADC, according to some embodiments of the disclosure.

FIG. 2 shows a CT pipeline ADC, according to some embodiments of the disclosure. A digital signal reconstruction filter is omitted in the FIGURE, for simplicity. The CT pipeline ADC has N+1 stages. As shown, the CT pipeline ADC has stage 0, stage 1, ... stage N−1, and stage N.

Stage 0 comprises $ADC_0$ 202 to digitize input signal $x_0(t)$ and generate a digital output signal $D_0$. Stage 0 further includes a $DAC_0$ 204 to reconstruct the input signal to the stage based on $D_0$ to generate a reconstructed signal. $DAC_0$ 204 can have a transfer function $g_{DAC}(t)$ (or pulse shape). Stage 0 further includes a CT delay circuit 206, which delays the input signal $x_0(t)$. The transfer function of the CT delay circuit 206 is shown as $G_{delay}(s)$. The amount of delay can match the delay of the $ADC_0$ 202 and $DAC_0$ 204. The CT delay element can be implemented in different ways to provide different frequency responses, desired behaviors, and/or characteristic impedances. Exemplary circuitry for the CT delay circuit 206 includes resistor-capacitor (RC) lattice, one or more inductor-capacitor (LC) lattices, transmission line, etc. Stage 0 further includes CT circuitry for performing subtraction of the delayed input signal from the CT delay circuit 206 by the reconstructed signal from $DAC_0$ 204, shown as summation node 208, to generate a residue signal. Stage 0 further includes a residue amplifier 210 to amplify the residue signal for conversion by Stage 1 and generate an amplified residue signal shown as $x_1(t)$. The residue amplifier 210 can have a transfer function, shown as $H(s)$.

Stage 1 comprises $ADC_1$ 212 to digitize an input signal to the stage, i.e., the amplified residue signal shown as $x_1(t)$, and generate a digital output signal $D_1$. Stage 1 further includes a $DAC_1$ 214 to reconstruct the input signal to the stage, i.e., the amplified residue signal $x_1(t)$, based on $D_1$ to generate a reconstructed signal. Stage 1 further includes a CT delay circuit 216, which delays the input signal to the stage, i.e., the amplified residue signal $x_1(t)$. Stage 1 further includes CT circuitry for performing subtraction of the delayed input signal from the CT delay circuit 216 by the reconstructed signal from $DAC_1$ 214, shown as summation node 218, to generate a residue signal. Stage 1 further includes a residue amplifier 220 to amplify the residue signal for conversion by Stage 2 and generate an amplified residue signal shown as $x_2(t)$.

The same architecture can be repeated for more stages of the CT pipeline ADC, if desired. For illustration, a second to the last stage, Stage N−1, is shown for the CT pipeline ADC. Stage N−1 comprises $ADC_{N-1}$ 222 to digitize an input signal to the stage, i.e., an amplified residue signal shown as $x_{N-1}(t)$, and generate a digital output signal $D_{N-1}$. Stage N−1 further includes a $DAC_{N-1}$ 224 to reconstruct the input signal to the stage, i.e., the amplified residue signal $x_{N-1}(t)$ based on $D_{N-1}$ to generate a reconstructed signal. Stage N−1 further includes a CT delay circuit 226, which delays the input signal to the stage, i.e., the amplified residue signal $x_{N-1}(t)$. Stage N−1 further includes CT circuitry for performing subtraction of the delayed input signal from the CT delay circuit 226 by the reconstructed signal from $DAC_{N-1}$ 224, shown as summation node 228, to generate a residue signal. Stage N−1 further includes a residue amplifier 230 to amplify the residue signal for conversion by Stage N and generate an amplified residue signal shown as $x_N(t)$.

The last stage, Stage N, comprises $ADC_N$ 232 to digitize an input signal to the stage, i.e., amplified residue signal shown as $x_{N-1}(t)$, and generate a digital output signal $D_N$.

Transfer functions of the CT delay circuits, DACs, and residue amplifiers can depend on the analog circuitry therein. The transfer functions of such circuitry can also differ from stage to stage, since the analog circuitry therein may differ.

Digital Signal Reconstruction for DT Pipeline ADC

Referring back to FIG. 1, a digital signal reconstruction filter 130 is included to combine the respective digital output signals ("$D_0$", "$D_1$", "$D_2$", "$D_3$" ... "$D_{N-1}$", and "$D_N$") from the stages of multi-stage ADC. The technical task of the digital signal reconstruction filter 130 is to form the final converter digital output signal $D_{OUT}$ based on the respective digital output signals, where the final converter digital output signal $D_{OUT}$ is reconstructed in such a way to accurately represent the analog input signal $x_0$.

One way to perform digital signal reconstruction is to start from the last digital output signal $D_N$ and combine $D_N$ with the digital output signal of the previous stage $D_{N-1}$ to form a reconstructed input signal to the previous stage $x'_{N-1}$. Then the result from combining $D_N$ and $D_{N-1}$ can be combined with the digital output signal of a further previous stage $D_{N-2}$ to form a reconstructed input signal to the further previous stage $x'_{N-2}$. The digital signal reconstruction filter 130 can continue to work in this manner all the way to $D_0$ to form the final digital output signal $D_{OUT}$, which would accurately represent the analog input signal $x_0$.

If the multi-stage ADC is a DT pipeline ADC, the digital signal reconstruction filter 130 is straight forward. $D_N$ is multiplied by the step size of the DAC ($G_{DAC}$) and divided by the gain of the residue amplifier (H). $D_{N-1}$ is multiplied by the step size of the DAC ($G_{DAC}$). To form $x'_{N-1}$, $D_N \cdot G_{DAC}/H$ and $D_{N-1} \cdot G_{DAC}$ are added together. $x_0$ can be reconstructed (i.e., finding $x'_0$) according to the following:

$$x'_0 = \sum_{k=0}^{N} \frac{D_k \cdot G_{DAC}}{H^k} = x_0 - \frac{e_N}{H^N} \qquad \text{eq. (1)}$$

Digital Signal Reconstruction for CT Pipeline ADC

Digital signal reconstruction filter 130 for a CT pipeline ADC is not as straight forward. The implementation and behavior of CT circuitry in the stages of the CT pipeline ADC complicates digital signal reconstruction, and finding a digital signal reconstruction filter 130 for a CT pipeline ADC is not trivial. Referring back to FIG. 2, the DACs in the stages has a transfer function $g_{DAC}(t)$ (also referred to as the pulse shape), and the residue amplifiers in the stages has a transfer function H(s). For simplicity, all the stages are assumed to have the identical CT circuitry therein, but it does not have to be the case. An example of H(s) is as follows:

$$H(s) = H_0/(1+s\tau) \qquad \text{eq. (2)}$$

H(s) can be of any suitable order and can have other definitions, and is not limited to the definition in Equation (2). The definition of H(s) would depend on the analog circuitry used for performing residue amplification. The technical task of the digital signal reconstruction filter 130 is to estimate a sampled version of the analog input signal $x_0(t)$, i.e., $x'_0[kT_s]$, from the respective digital output signals ("$D_0$", "$D_1$", "$D_2$", "$D_3$" ... "$D_{N-1}$", and "$D_N$") of the stages in the CT pipeline ADC. Similar to the approach used in the CT pipeline ADC, one way to perform digital signal reconstruction is to start from the last digital output signal $D_N$ and combine $D_N$ with the digital output signal of the previous stage $D_{N-1}$ to determine a reconstructed digital output signal $x'_{N-1}[kT_s]$ which accurately represents the analog input signal to the previous stage $x_{N-1}(t)$. Phrased differently, the digital signal reconstruction filter can estimate $x_{N-1}(t)$ from $D_{N-1}$ and $D_N$. Then, the result from combining $D_N$ and $D_{N-1}$ can be combined with the digital output signal of a further previous stage $D_{N-2}$ to determine a reconstructed digital output signal $x'_{N-2}[kT_s]$ which accurately represents the analog input signal to the previous stage $x_{N-2}(t)$. The digital signal reconstruction filter 130 can continue to work in this manner all the way to $D_0$ to form the final digital output signal $D_{OUT}$, which would accurately represent the sampled version of the analog input signal $x_0(t)$, i.e., $x'_0[kT_s]$.

To ensure proper digital signal reconstruction, it is desirable to ensure that all of the respective digital output signals ("$D_0$", "$D_1$", "$D_2$", "$D_3$" ... "$D_{N-1}$", and "$D_N$") do not contribute to the final digital output signal $D_{OUT}$, representing the sampled version of the analog input signal $x_0(t)$, i.e., $x'_0[kT_s]$. The cancellation of the respective digital output signals from the stages of the CT pipeline ADC during the digital signal reconstruction process is not trivial. The challenges in digital signal reconstruction are explained in the following passages.

A relationship between $D_{N-1}$ and $D_N$ is characterized, and the relationship is used to determine reconstructed digital output signal $x'_{N-1}[kT_s]$. Referring back to the last two stages of the CT pipeline converter of FIG. 2, it can be seen that:

$$x_N(t) = x_{N-1}(t) * g_{delay}(t) * h(t) - \sum_k D_{N-1}[kT_S](g_{DAC} * h)(t - nT_S) \qquad \text{eq. (3)}$$

* is the convolution operator, and $g_{delay}(t)$ and h(t) denote the impulse responses of the CT delay circuit (CT delay circuit 226) and residue amplifier (residue amplifier 230) respectively. $D_N$ is the result of quantizing $x_N[kTs]$, and can be expressed as:

$$D_N[k] = x_N[kT_S] + e_N[k] \qquad \text{eq. (4)}$$

$e_N$ is the quantization noise introduced by the ADC in stage N ($ADC_N$ 232) at the end of the CT pipeline ADC.

As discussed previously, proper digital signal reconstruction at the end of the CT pipeline ADC aims to remove contribution of $D_{N-1}$ from $x'_{N-1}[kT_s]$. To understand how to remove contribution of $D_{N-1}$ from $x'_{N-1}[kT_s]$, the relationship between $D_{N-1}$ and $D_N$ (a sampled version of $x_N(t)$, i.e., $x_N[kTs]$) is characterized first. Once the relationship between $D_{N-1}$ and $D_N$ is characterized, it is possible to remove the contribution of $D_{N-1}$ from $x'_{N-1}[kT_s]$.

Figure 3:
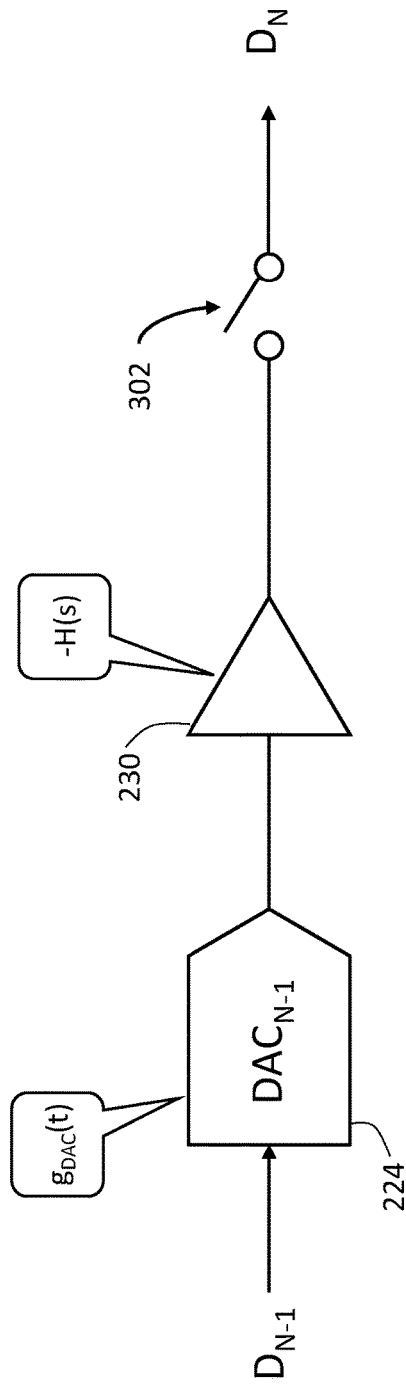
FIGS. 3 and 4 show two discrete-time systems relating $D_{N-1}$ and $D_N$, according to some embodiments of the disclosure.
Figure 4:
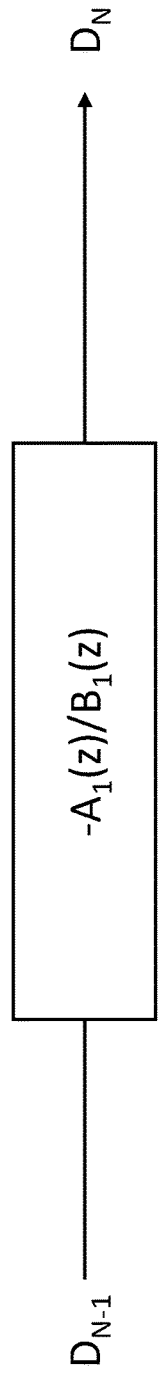

FIGS. 3 and 4 show two DT systems relating $D_{N-1}$ and $D_N$, according to some embodiments of the disclosure. In FIGS. 2 and 3, it can be seen that $D_{N-1}$ drives a cascade of two filters with impulse responses $g_{DAC}(t)$ (associated with the $DAC_{N-1}$ 224) and $-h(t)$ (associated with residue amplifier 230 and inversion due to subtraction at summation node 228) respectively. The output signal of the cascade of two filters is then sampled by sampler 302 representing the effect of the ADC in stage N ($ADC_N$ 232).

The final output signal of the signal path $D_N$ seen in FIG. 3 can be thought of as the result of filtering $D_{N-1}$ by a DT system whose transfer function is shown as $-A_1(z)/B_1(z)$ in FIG. 4. In other words, $-A_1(z)/B_1(z)$ relates $D_{N-1}$ and $D_N$, and represents the overall transfer function the DT system seen in FIG. 3, i.e., the transfer function of the DAC ($DAC_{N-1}$ 224) and the transfer function of the residue amplifier (residue amplifier 230).

As mentioned previously, part of the technical task of digital signal reconstruction filter is to remove the contribution of $D_{N-1}$ from the reconstructed digital output signal $x'_{N-1}[kT_s]$. In other words, the transfer function $D_{N-1}$ to $x'_{N-1}[kT_s]$ is preferably zero. Based on the transfer function $-A_1(z)/B_1(z)$ of the DT system seen in FIG. 4 relating $D_{N-1}$ and $D_N$, it is possible to design a filter for filtering $D_N$ as part of the digital signal reconstruction filter to remove the contribution of $D_{N-1}$ in $x'_{N-1}[kT_s]$. Such a filter can inverse the transfer function $-A_1(z)/B_1(z)$ of the DT system seen in FIG. 3 to cancel the contribution of $D_{N-1}$ in $x'_{N-1}[kT_s]$.

In some embodiments, a digital signal reconstruction filter for a CT pipeline comprises a first digital filter to filter a first digital output signal from a first stage of the CT pipeline ADC (e.g., $D_N$ of stage N). The first digital filter can generate a first filtered digital output signal. The first digital filter can remove a contribution of a second digital output signal from a second stage (e.g., $D_{N-1}$ of stage N-1) in front of the first stage of the CT pipeline ADC from a reconstructed digital output signal (e.g., $x'_{N-1}[kT_s]$). The first digital filter can be determined based on a transfer function relating the second digital output signal (e.g., $D_{N-1}$) and the first digital output signal (e.g., $D_N$). The transfer function can correspond to $-A_1(z)/B_1(z)$ of the DT system seen in FIG. 4, and the first digital filter can be designed to inverse the effect of the transfer function.

When using a single first digital filter $B_1(z)/A_1(z)$ to filter $D_N$ to remove the contribution of $D_{N-1}$ from $x'_{N-1}[kT_s]$, the single first digital filter may be anti-casual (e.g., $B_1(z)/A_1(z)$ may be anti-causal) and possibly difficult or inefficient to implement efficiently in the digital domain. The following passages describe some techniques, which can be applied to make digital signal reconstruction more effective and efficient.

Designing an Effective and Efficient Digital Signal Reconstruction Filter

Rather than using just a single digital filter to filter $D_N$ to remove the contribution of $D_{N-1}$ from $x'_{N-1}[kT_s]$, it is possible to use two digital filters to filter $D_N$ and $D_{N-1}$ respectively to remove the contribution of $D_{N-1}$ from $x'_{N-1}[kT_s]$. The two digital filters creates equal and opposite signal paths for $D_{N-1}$ to ensure that the contribution of $D_{N-1}$ cancels out.

Figure 5:
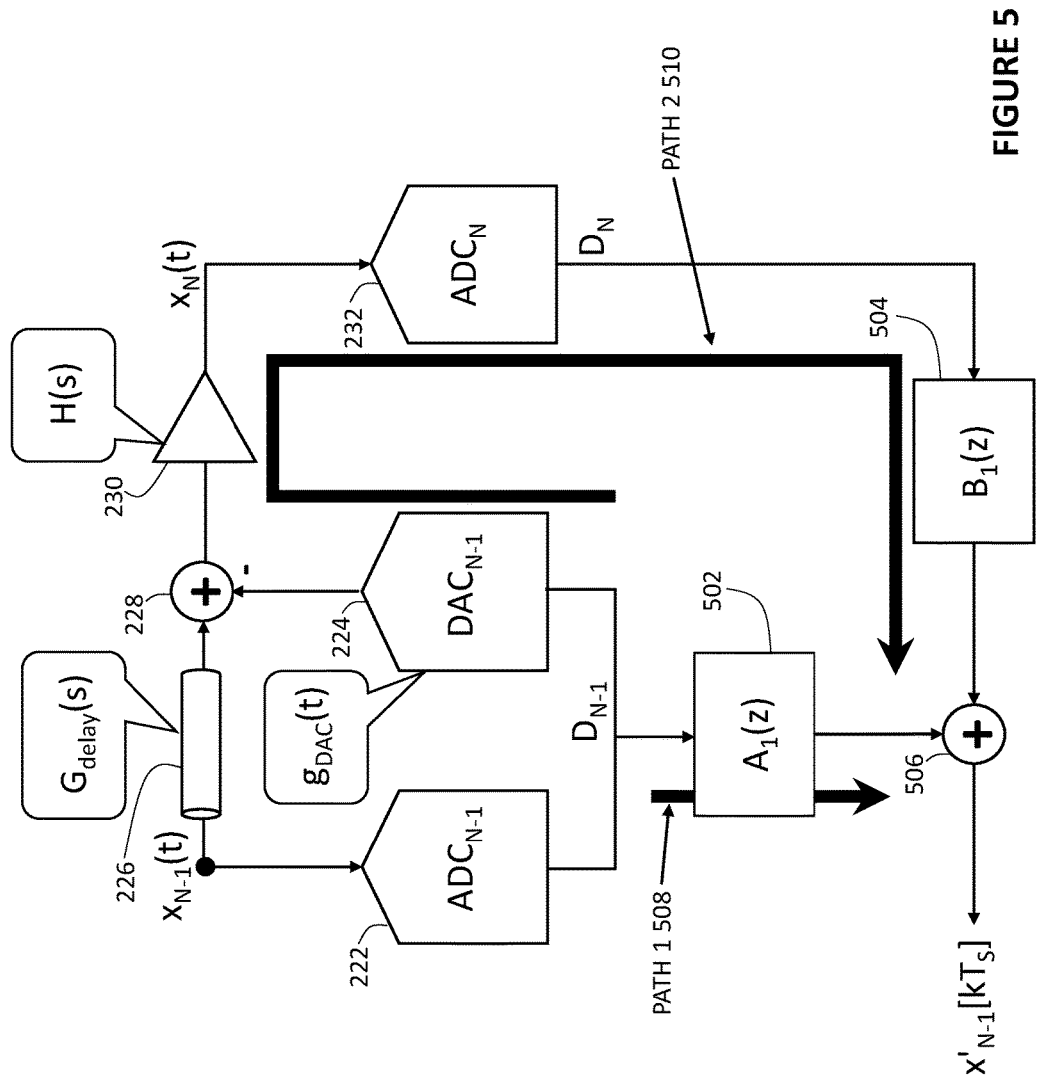
FIG. 5 shows a first digital filter $B_1(z)$ and a second digital filter $A_1(z)$ for processing $D_{N-1}$ and $D_N$ respectively, according to some embodiments of the disclosure.

FIG. 5 shows a first digital filter $B_1(z)$ 504 and a second digital filter $A_1(z)$ 502 for processing $D_{N-1}$ and $D_N$ respectively, according to some embodiments of the disclosure. The first digital filter $B_1(z)$ 504 and the second digital filter $A_1(z)$ 502 are part of a digital signal reconstruction filter for processing the respective digital outputs of stages in a CT pipeline ADC.

In FIG. 5, the first digital filter $B_1(z)$ 504 filters a first digital output signal $D_N$ from a first stage (stage N) of the CT pipeline ADC and generates a first filtered digital output signal, and the second digital filter $A_1(z)$ 502 filters a second digital output signal $D_{N-1}$ from a second stage (stage N−1) in front of the first stage of the CT pipeline ADC (stage N−1) of the CT pipeline ADC to generate a second filtered digital output signal. A summer 506 can sum the first filtered digital output signal and the second filtered digital output signal to generate the reconstructed digital output signal $x'_{N-1}[kT_s]$. Together, the first digital filter $B_1(z)$ 504 and the second digital filter $A_1(z)$ 502 can remove a contribution of the second digital output signal $D_{N-1}$ of the second stage (stage N−1) from a reconstructed digital output signal $x'_{N-1}[kT_s]$.

The first digital filter $B_1(z)$ 504 and the second digital filter $A_1(z)$ 502 can be determined based on a transfer function relating $D_{N-1}$ and $D_N$. Moreover, first digital filter $B_1(z)$ 504 and the second digital filter $A_1(z)$ 502 can be designed to ensure that the transfer function relating $D_{N-1}$ and the output of Path 1 508 (the second filtered digital output signal) and the transfer function relating $D_{N-1}$ and the output of Path 2 510 (the first filtered digital output signal) are equal and opposite of each other. When the first filtered digital output signal and the second filtered digital output signal are summed, the contribution from $D_{N-1}$ would cancel out. As seen in FIG. 5, the transfer function relating $D_{N-1}$ and the output of Path 1 508 is $A_1(z)$. As seen in FIG. 5, the transfer function relating $D_{N-1}$ and the output of Path 2 510 is a combination of $-A_1(z)/B_1(z)$ (previously illustrated by FIGS. 3 and 4), and $B_1(z)$. In other words, the overall transfer function $D_{N-1}$ and the output of Path 2 510 is $(-A_1/(z)/B_1(z)) \cdot B_1(z) = -A_1(z)$. That means that the transfer function relating $D_{N-1}$ and the output of Path 1 508 is equal and opposite of the transfer function relating $D_{N-1}$ and the output of Path 2 510 ($A_1(z)$ is equal and opposite of $-A_1(z)$). Accordingly, the contribution of the second digital output signal $D_{N-1}$ is cancelled out and removed from a reconstructed digital output signal $x'_{N-1}[kT_s]$ after the first filtered digital output signal and the second filtered digital output signal are combined. Phrased differently, the second digital output signal $D_{N-1}$ does not contribute to the reconstructed digital output signal $x'_{N-1}[kT_s]$. Moreover, first digital filter $B_1(z)$ 504 and the second digital filter $A_1(z)$ can be implemented efficiently since it is not in the form of $B_1(z)/A_1(z)$.

The first digital filter $B_1(z)$ 504 and the second digital filter $A_1(z)$ can be determined from a transfer function relating $D_{N-1}$ and $D_N$, represented by $-A_1(z)/B_1(z)$ in FIG. 4. The transfer function relating the second digital output signal $D_{N-1}$ and the first digital output signal $D_N$ can, as seen in FIG. 3, correspond to a transfer function of a (CT) digital-to-analog converter ($DAC_{N-1}$ 224) in the second stage and a transfer function of a CT residue amplifier (residue amplifier 230) amplifying a residue from the second stage and providing an amplified residue to the first stage.

In some embodiments, the transfer function relating $D_{N-1}$ and $D_N$, can be characterized by analytically determining the transfer function of $DAC_{N-1}$ 224 and the transfer function of the residue amplifier 230 based on the circuitry implementing $DAC_{N-1}$ 224 and the residue amplifier 230. In some cases, the transfer function of the sampler 302 is also taken into account. Once the overall transfer function relating $D_{N-1}$ and $D_N$ is determined analytically, it is possible to determine CT filter responses for the first digital filter $B_1(z)$ 504 and the second digital filter $A_1(z)$ 502. Part of determining the filter responses for the first digital filter $B_1(z)$ 504 and the second digital filter $A_1(z)$ 502 can include determining DT equivalent filter responses based on the CT filter responses, and finding digital filter coefficients which effectively and efficiently approximates those DT equivalent filter responses. Preferably, the first digital filter $B_1(z)$ 504 and the second digital filter $A_1(z)$ 502 are implemented with finite impulse response (FIR) filters of a certain desirable length (or number of taps) for efficient digital implementation. In some cases, the first digital filter $B_1(z)$ 504 and the second digital filter $A_1(z)$ 502 are infinite impulse response (IIR) filters or approximations thereof. FIR filters are generally preferred, since they can be used at high speed.

Figure 6:
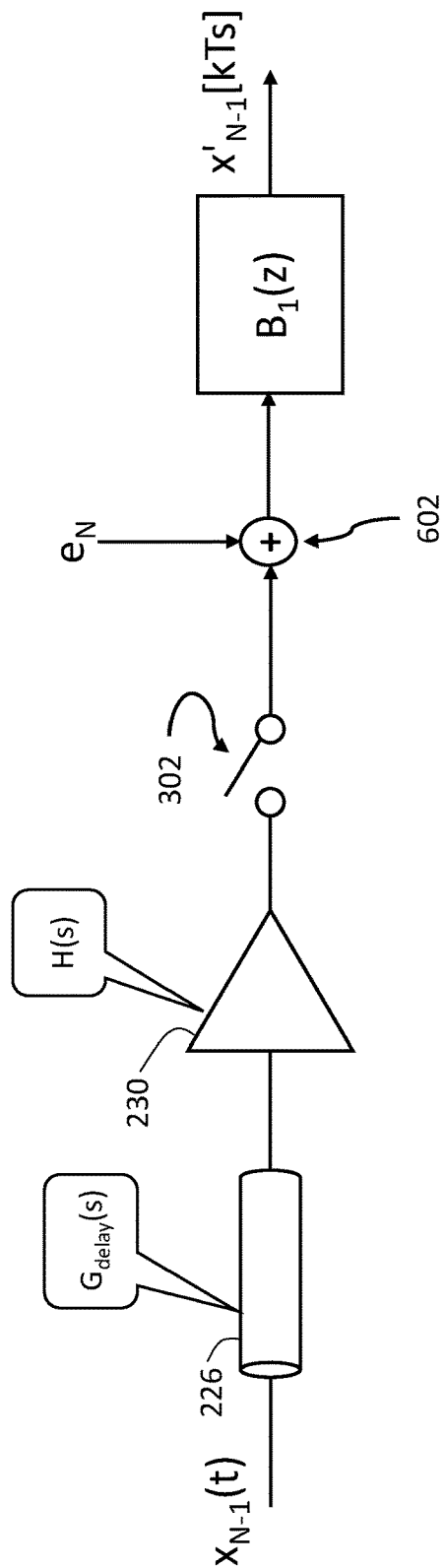
FIG. 6 shows a signal path from $x_{N-1}(t)$ to $x'_{N-1}[kT_S]$, according to some embodiments of the disclosure.

FIG. 6 shows a signal path from $x_{N-1}(t)$ to $x'_{N-1}[kT_s]$, based on the embodiment seen in FIG. 5, according to some embodiments of the disclosure. $x_{N-1}(t)$ experiences transfer function $G_{delay}(S)$ of the CT delay circuit 226 and the transfer function $H(s)$ of the residue amplifier 230. Then the output from the residue amplifier 230 is sampled by sampler 302 representing the effect of the ADC in stage N ($ADC_N$ 232). Also, the quantization noise $e_N$ from the ADC in stage N ($ADC_N$ 232) is introduced to the signal by summer 602. The signal from the summer 602 is then processed by the first digital filter 504 $B_1(z)$. Note that the first digital filter $B_1(z)$ 504 filters the quantization noise $e_N$, and thus first digital filter $B_1(z)$ 504 is part of the noise transfer function (NTF) of the CT pipeline converter.

Instead of starting with determining the transfer function relating $D_{N-1}$ to $D_N$, it is possible to select/determine one or more of the first digital filter $B_1(z)$ 504 and the second digital filter $A_1(z)$ 502 to achieve a particular result for the CT pipeline ADC by determining the rest of the variables accordingly. The variables in the filter design can include: the first digital filter $B_1(z)$ 504, the second digital filter $A_1(z)$, the transfer function of $DAC_{N-1}$ 224, the transfer function of the residue amplifier 230, and the transfer function of sampler 302 (illustrated in FIG. 3). Referring back to FIG. 6, the first digital filter $B_1(z)$ 504 can have an effect on the quantization noise $e_N$, and thus first digital filter $B_1(z)$ 504 is part of the NTF of the CT pipeline converter (which includes the transfer function from $e_N$ to $x'_{N-1}[kT_s]$). Put simply, first digital filter $B_1(z)$ 504 can suppress quantization noise $e_N$. If a certain NTF is desired, it is possible to select the first digital filter $B_1(z)$ 504 to have a particular NTF or effect on filtering the quantization noise $e_N$, and set the rest of the variables accordingly. For instance, it is possible to select the first digital filter $B_1(z)$ 504, then design the residue amplifier 230 to have a particular transfer function such that conditions are met for proper digital signal reconstruction.

Figure 7:
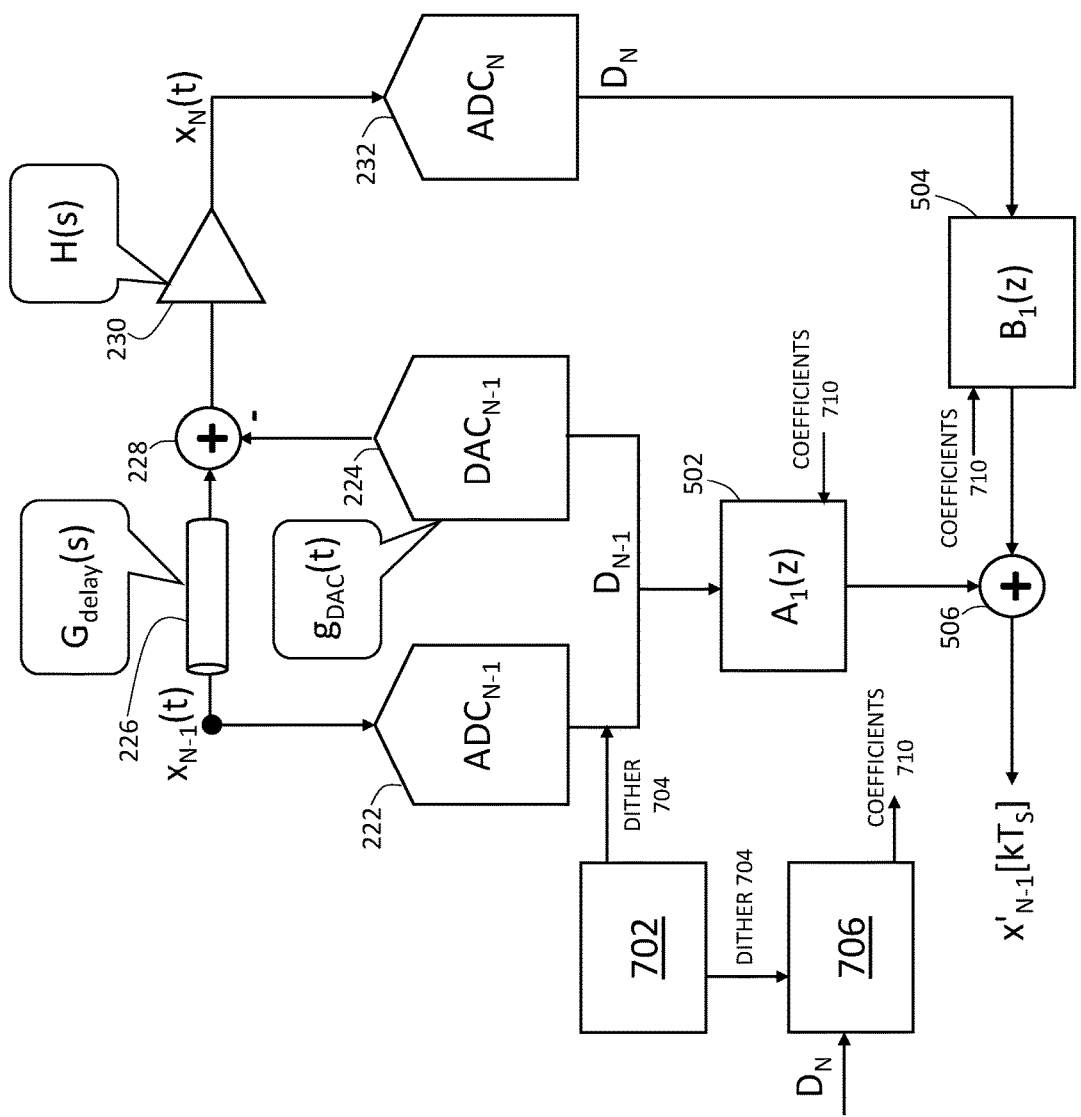
FIG. 7 shows dither injection to estimate a transfer function relating $D_{N-1}$ and $D_N$, according to some embodiments of the disclosure.

In some embodiments, the transfer function relating $D_{N-1}$ and $D_N$ can be estimated through dither injection (as opposed to analytically through knowledge of the circuitry). FIG. 7 shows dither injection to estimate a transfer function relating $D_{N-1}$ and $D_N$, according to some embodiments of the disclosure. To estimate the transfer function, the CT pipeline ADC can include a dither signal generator 702 to inject a dither signal 704 to an input of a DAC in the second stage. The dither signal 704 is preferably a random signal which is uncorrelated with $D_{N-1}$. The dither signal 704 can be added to $D_{N-1}$ such that the dither signal 704 can experience the signal path from $D_{N-1}$ to $D_N$. The CT pipeline ADC can further include processing logic 706 to correlate the dither signal 704 with the first digital output signal $D_N$ to estimate/extract the transfer function. The result of the correlation can correspond to the transfer function of the signal path from $D_{N-1}$ to $D_N$ (thus the transfer function relating from $D_{N-1}$ to $D_N$). Depending on where the dither signal is injected and which digital output signal is used for correlating with the injected dither signal, it is possible to extract a transfer function of a signal path from the node of where the dither signal is injected to the node of the digital output signal used for the correlation.

Processing logic 706 can be a microprocessor on-chip with the CT pipeline ADC executing instructions to perform the correlation. Dither injection and correlation can be performed in the background or in the foreground. Dither injection and correlation can be performed from time to time, e.g., to re-assess the transfer function if operating conditions change, to update filter coefficients accordingly.

Once the transfer function is extracted, a Steiglitz-McBride iteration can be applied to the extracted transfer function to determine filter responses for the first digital filter $B_1(z)$ 504 and the second digital filter $A_1(z)$ 502. A Steiglitz-McBride iteration can find filter implementations for the first digital filter $B_1(z)$ 504 and the second digital filter $A_1(z)$ 502 which are efficient and can approximate the extracted transfer function. The processing logic 706 can write coefficients or updated coefficients 710 into first digital filter $B_1(z)$ 504 and the second digital filter $A_1(z)$ 502, whose coefficients can be programmable digitally.

Referring back to FIGS. 4 and 5, the constraints on the filter design specifies the ratio between the first digital filter $B_1(z)$ 504 and the second digital filter $A_1(z)$ 502. Therefore, it is possible to scale both of the filters by a same factor to achieve the same result. For instance, it may be desirable to scale the first digital filter $B_1(z)$ 504 and the second digital filter $A_1(z)$ 502 in a manner such that a DC (direct current) gain of $A_1(z)$ is unity, so that the DC gain of $B_1(z)$ becomes $1/H_0$. In such instance, the suppression of $e_N$ at DC would be identical/comparable to the discrete-time counterpart (a DT pipeline ADC).

Referring back to FIGS. 3 and 4, it can be seen that with the filtering configuration shown in FIG. 5, $A_1(z)/B_1(z)$ corresponds to a DT equivalent of a transfer function $G_{delay}(s)H(s)$. In some embodiments, first digital filter $B_1(z)$ 504 can be a DT equivalent of the denominator polynomial of the transfer function $H(s)$ of residue amplifier 230, scaled by $1/H_0$. With a first order $H(s)$, first digital filter $B_1(z)$ 504 can be a two-tap FIR filter. Second digital filter $A_1(z)$ 502 can be a numerator polynomial of the DT equivalent of $G_{delay}(S)H(s)$. Second digital filter $A_1(z)$ 502 can also be a FIR filter.

Figure 8:
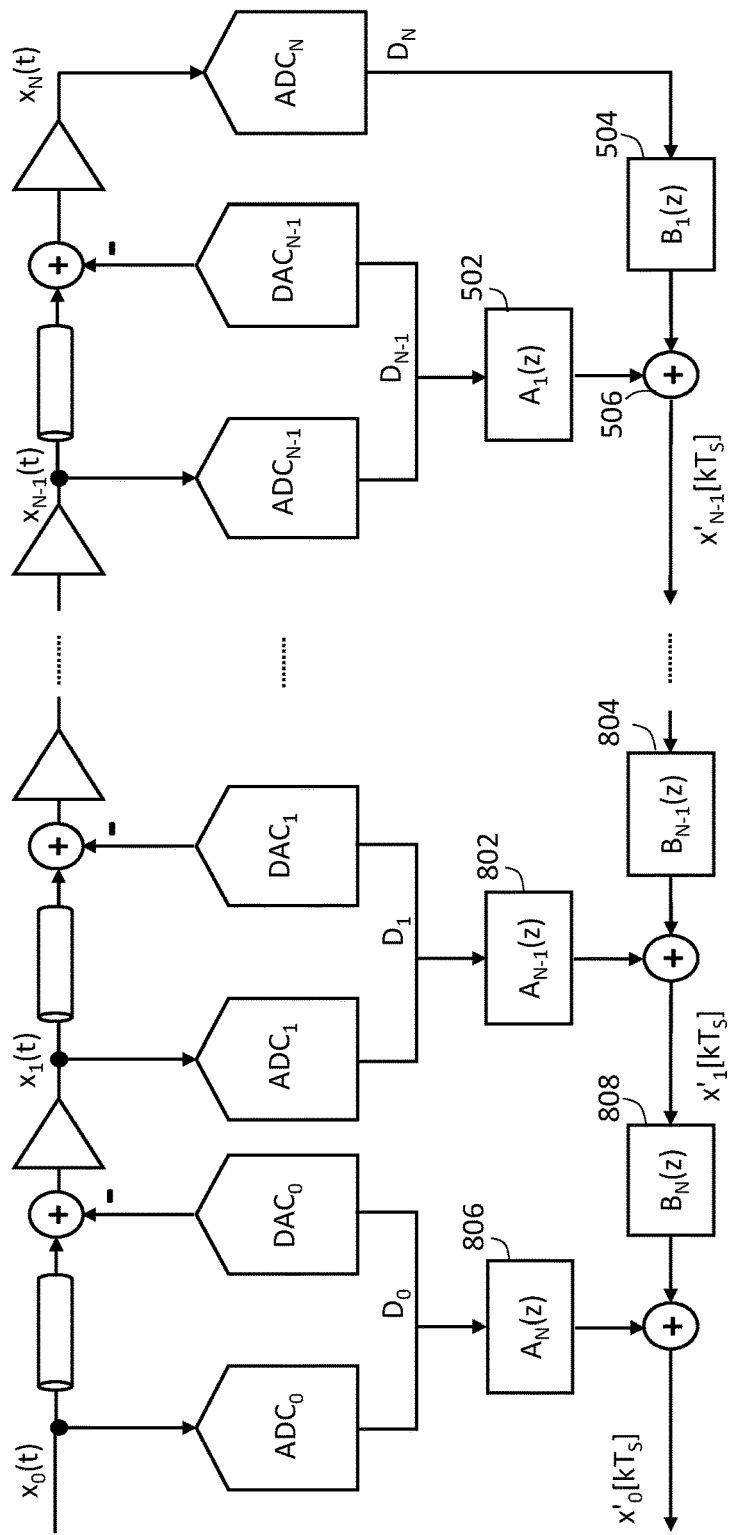
FIG. 8 shows an exemplary CT pipeline ADC with digital signal reconstruction, according to some embodiments of the disclosure.

Digital signal reconstruction shown in FIG. 7 can be extended to all stages of the CT pipeline ADC as illustrated by FIG. 2. FIG. 8 shows an exemplary CT pipeline ADC with digital signal reconstruction, according to some embodiments of the disclosure. $D_{N-1}$ is filtered by $A_1(z)$ as discussed previously, and more generally, $D_k$ is filtered by $A_{N-k}(Z)$ (e.g., $D_1$ is filtered by $A_{N-1}(z)$, and $D_0$ is filtered by $A_N(z)$, and so on). $A_{N-k}(Z)$ can correspond to the numerator of the DT transfer function from $D_k$ to $D_N$. $x'_{k+1}[kT_S]$ is filtered by filter $B_{N-k}(Z)$. The result from filtering $D_k$ by $A_{N-k}(Z)$ is combined (or summed) with the result from filtering $x'_{k+1}[kT_S]$ by filter $B_{N-k}(Z)$ to form $x'_k[kT_S]$.

In the same fashion as the technique described in relation to FIG. 7, the filters for digital signal reconstruction in FIG. 8 can be implemented with FIR filters filtering the respective digital output signals from the stages of the CT pipeline ADC. FIR filters are generally preferred, since they can be used at high speed. Higher order poles in the CT delay circuits and residue amplifiers in the CT pipeline ADC can potentially increase the length (number of taps) for the FIR filters.

$B_{N-k}(Z)$ can all be the same as $B_1(z)$. $B_1(z)$, which can correspond to the denominator polynomial of the transfer function $H(s)$ of residue amplifier, can cancel the pole of the residue amplifier (assuming the CT delay circuit has a large bandwidth). $A_k(Z)$, which can correspond to a numerator polynomial of the DT equivalent of $G_{delay}(S)H(s)$, can represent the zeros of the DT equivalent transfer function from $D_{N-k}$ to $D_N$.

In some cases, the number of taps for $A_k(Z)$ can increase with k, indicating that the FIR filters closer to the input of the CT pipeline ADC are longer. This characteristic of the digital signal reconstruction filter is consistent with the fact that the output of the stage 0 DAC, i.e., $D_0$, is processed by a long chain of residue amplifiers and CT delay circuits. The long chain of residue amplifiers and CT delay circuits has a large influence and $D_0$ has to be cancelled out by the digital signal reconstruction process. Accordingly, $A_k(Z)$ can increase with k to account for the large influence of $D_0$ through the long chain of residue amplifiers and CT delay circuits.

As explained previously, it is possible to implement a single digital filter $B_1(z)/A_1(z)$ to filter $D_N$ and remove the contribution of $D_{N-1}$ from $x'_{N-1}[kT_s]$. The single digital filter can be realizable as an IIR filter whose transfer function has a polynomial numerator and a polynomial denominator. But IIR filters in digital are not as fast as FIR filters, since FIR filters can operate at higher speeds (e.g., through interleaving). Rather than using just a single digital filter to filter $D_N$ to remove the contribution of $D_{N-1}$ from $x'_{N-1}[kT_s]$, it is possible to use three FIR digital filters to remove the contribution of $D_{N-1}$ from $x'_{N-1}[kT_s]$.

Figure 9:
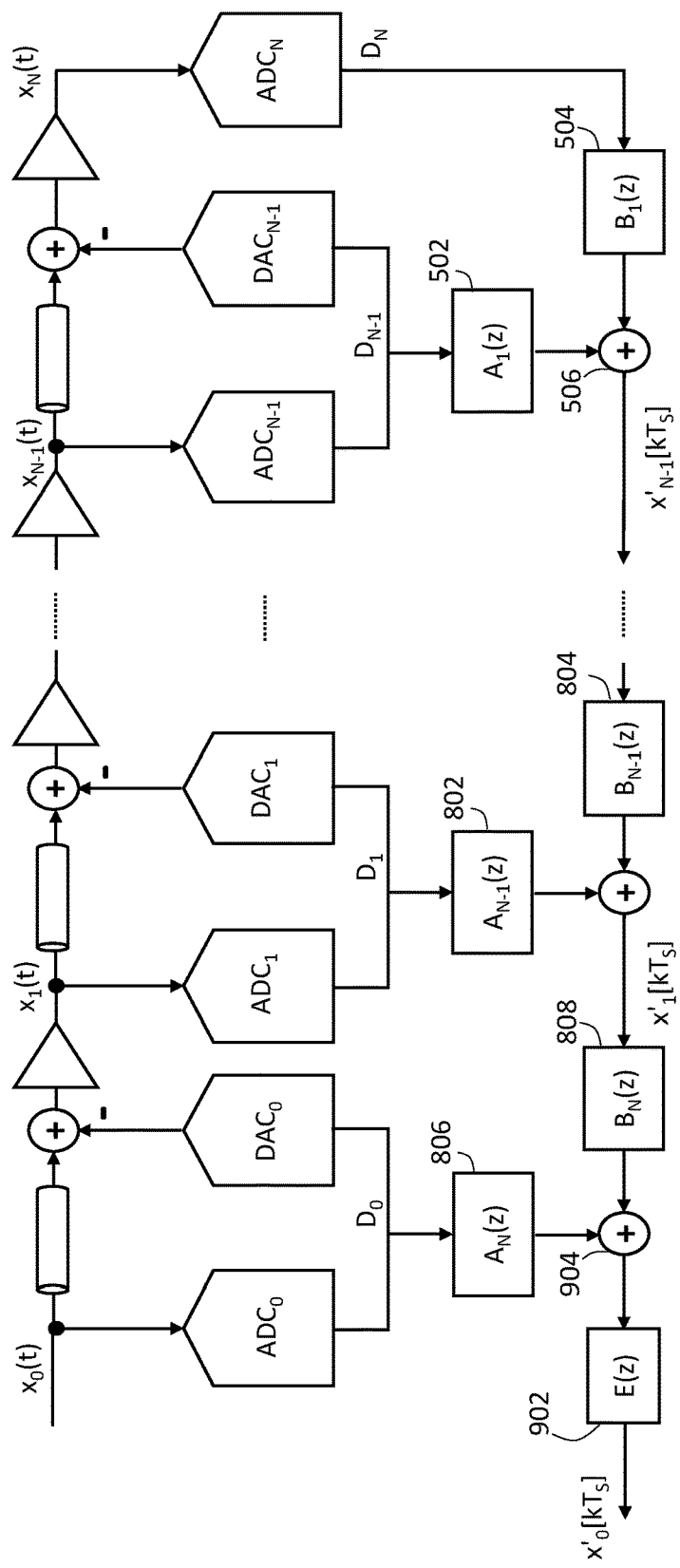
FIG. 9 shows an additional optional digital equalization filter $E(z)$, according to some embodiments of the disclosure.

FIG. 9 shows an additional optional digital equalization filter $E(z)$ 902, according to some embodiments of the disclosure. Similar to the digital signal reconstruction filter in FIG. 8, the digital signal reconstruction filter in FIG. 9 has the first digital filter $B_1(z)$ 504 and the second digital filter $A_1(z)$ for performing digital signal reconstruction. Additionally, an optional digital equalization filter $E(z)$ 902 is included as part of the digital signal reconstruction filter for processing the respective digital outputs of stages in a CT pipeline ADC. In FIG. 9, the first digital filter $B_1(z)$ 504 filters a first digital output signal $D_N$ from a first stage (stage N) of the CT pipeline ADC and generates a first filtered digital output signal, and the second digital filter $A_1(z)$ 502 filters a second digital output signal $D_{N-1}$ from a second stage (stage N−1) in front of the first stage of the CT pipeline ADC (stage N−1) of the CT pipeline ADC to generate a second filtered digital output signal. A summer 506 can sum the first filtered digital output signal and the second filtered digital output signal. A result generated by or downstream from summer 506 can be filtered by digital equalization filter E(z) 902 to generate the reconstructed digital output signal x'$_{N-1}$[kT$_S$]. In the example shown in FIG. 9, E(z) 902 filters a result from summer 904 which combines the signals produced by A$_N$(z) 806 and B$_N$(z) 808 to generate the reconstructed digital output signal x'$_0$[kT$_S$].

With this filter configuration, it is possible to, in some cases, set E(z) to be 1/A$_1$(z), if the desired (single) filter for filtering D$_N$ is B$_1$(z)/A$_1$(z) to remove the contribution of D$_{N-1}$ from x'$_{N-1}$[kT$_S$]. In other words, digital equalization filter E(z) can correspond to an inverse of the second digital filter A$_1$(z) 502 to filter a combined signal downstream from the summer 506 to generate the reconstructed digital output signal. With E(z)=1/A$_1$(z):

$$x'_{N-1}[kT_S] = D_{N-1} + D_N \cdot \frac{B_1(z)}{A_1(z)} \qquad \text{eq. (5)}$$

In Equation 5, it can be seen that x'$_{N-1}$[kT$_S$] appears as D$_N$ processed by a filter having a transfer function of B$_1$(z)/A$_1$(z). Mathematically, the digital equalization filter E(z) 902 takes the polynomial denominator A$_1$(z) out and applies 1/A$_1$(z) in the end after all the filtered digital output signals are summed. Together, a first digital filter B$_1$(z) 504, a second digital filter A$_1$(z) 502, and a digital equalization filter E(z) 902, can remove a contribution of the second digital output signal D$_{N-1}$ of the second stage (stage N−1) from a reconstructed digital output signal x'$_{N-1}$[kT$_S$], without requiring an IIR filter (i.e., having a polynomial numerator and polynomial denominator) in the digital signal reconstruction filter.

In some embodiments, at least one of the first digital filter B$_1$(z) 504, the second digital filter A$_1$(z) 502, and the digital equalization filter E(z) 902 is a FIR filter. In some embodiments, the first digital filter B$_1$(z) 504, the second digital filter A$_1$(z) 502, and the digital equalization filter E(z) 902 are FIR filters.

In some cases, E(z) 902 can be implemented to undo a low pass filter response of the signal path having the residue amplifiers and B(z)'s. In practice, E(z) 902 does not have to be exactly or precisely 1/A$_1$(z). In some cases, the amplitude of E(z) 902 is similar to the amplitude of 1/A$_1$(z) in a certain band of interest. Therefore, E(z) 902 can be implemented efficiently and can be made simpler than a filter which is exactly 1/A$_1$(z).

Methods and Systems for Digital Signal Reconstruction

Figure 10:
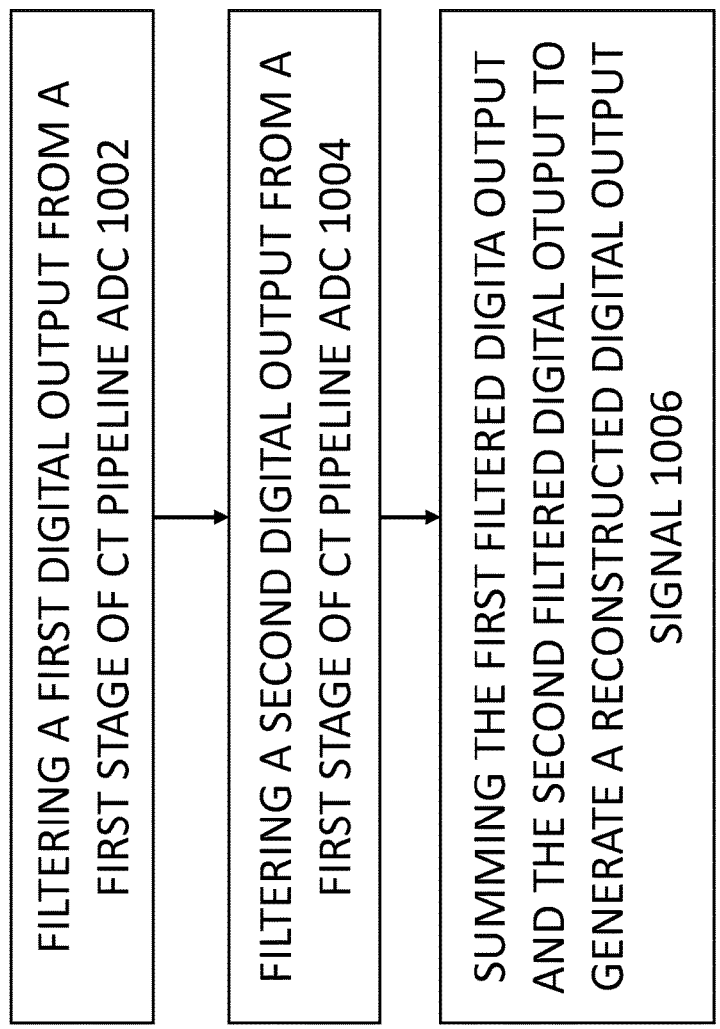
FIG. 10 is a flow diagram illustrating a method for digital signal reconstruction in a CT multi-stage ADCs, according to some embodiments of the disclosure.

FIG. 10 is a flow diagram illustrating a method for digital signal reconstruction in a CT multi-stage ADCs, according to some embodiments of the disclosure. In 1002. a first digital output signal from a first stage of the CT pipeline ADC is filtered by a first digital filter to generate a first filtered digital output signal. In 1004, a second digital output signal from a second stage of the CT pipeline ADC is filtered by a second digital filter to generate a second filtered digital output signal. In 1006, the first filtered digital output signal and the second filtered digital output signal are summed to generate a reconstructed digital output signal. Advantageously, the first digital output signal does not contribute to the reconstructed digital output signal. Preferably, the first digital filter and the second digital filter are FIR filters.

In some embodiments, the method can further include determining the first digital filter and the second digital filter based on a transfer function relating the first digital output signal and the second digital output signal.

In some cases, the transfer function can be estimated by injecting a dither signal to an input of a DAC of the first stage, and correlating the second digital output signal with the dither signal to estimate a transfer function relating the first digital output signal and the second digital output signal.

In some embodiments, the method can further include filtering a summed signal generated from summing the first filtered digital output signal and the second filtered output digital signal by a digital equalization filter, wherein, optionally, the digital equalization filter corresponds to an inverse of the first digital filter. Preferably, the digital equalization filter is a FIR filter.

A CT pipeline ADC can be implemented to perform conversion with digital signal reconstruction. The CT pipeline ADC can include a first CT converter stage for converting an analog input signal into a first digital output signal and generating a first amplified residue signal and a second CT converter stage for converting the first amplified residue signal into a second digital output signal. The CT pipeline ADC further includes a digital signal reconstruction filter to remove a contribution of a first digital output signal from a reconstructed output, wherein the digital signal reconstruction filter is determined based on a transfer function relating the first digital output signal and the second digital output signal.

In some embodiments, the digital signal reconstruction filter comprises: a first digital filter to filter the first digital output signal, a second digital filter to filter the second digital output signal, a summer to combine output signals of the first digital filter and the second digital filter, and an equalization filter to filter a result generated by or downstream the summer.

In some embodiments, the transfer function relating the first digital output signal and the second digital output signal is estimated by injecting a dither signal to an input of a DAC in the first CT converter stage and correlating the dither signal and the second digital output signal.

EXAMPLES

Example 1 is a method for digital signal reconstruction in a CT pipeline ADC, the method comprising: filtering a first digital output signal from a first stage of the CT pipeline ADC by a first digital filter to generate a first filtered digital output signal; filtering a second digital output signal from a second stage of the CT pipeline ADC by a second digital filter to generate a second filtered digital output signal; and summing the first filtered digital output signal and the second filtered digital output signal to generate a reconstructed digital output signal.

In Example 2, Example 1 can further include: determining the first digital filter and the second digital filter based on a transfer function relating the first digital output signal and the second digital output signal.

In Example 3, Example 1 or 2 can further include: injecting a dither signal to an input of a digital-to-analog converter of the first stage; and correlating the second digital output signal with the dither signal to estimate a transfer function relating the first digital output signal and the second digital output signal.

In Example 4, any one of Examples 1-3 can further include: the first digital output signal does not contribute to the reconstructed digital output signal.

In Example 5, any one of Examples 1-4 can further include: the first digital filter and the second digital filter being finite impulse response filters.

In Example 6, any one of Examples 1-5 can further include: filtering a summed signal generated from summing the first filtered digital signal and the second filtered digital signal by a digital equalization filter, wherein the digital equalization filter corresponds to an inverse of the first digital filter.

In Example 7, Example 6 can further include: the digital equalization filter being a finite impulse response filter.

Example 8 is a digital signal reconstruction filter for a CT pipeline ADC, the digital signal reconstruction filter comprising: a first digital filter to filter a first digital output signal from a first stage of the CT pipeline ADC, to generate a first filtered digital output signal, and to remove a contribution of a second digital output signal from a second stage in front of the first stage of the CT pipeline ADC from a reconstructed digital output signal; wherein the first digital filter is determined based on a transfer function relating the second digital output signal and the first digital output signal.

In Example 9, Example 8 can further include: a second digital filter to filter the second digital output signal to generate a second filtered digital output signal; and a summer to sum the first filtered digital output signal and the second digital output signal to generate the reconstructed digital output signal.

In Example 10, Example 9 can further include: a digital equalization filter to filter a combined signal downstream from the summer to generate the reconstructed digital output signal.

In Example 11, Example 10 can further include: at least one of the first digital filter, the second digital filter, and the digital equalization filter being a finite impulse response filter.

In Example 12, Example 10 can further include: the first digital filter, the second digital filter, and the digital equalization filter being finite impulse response filters.

In Example 13, any one of Examples 8-12 can further include: the transfer function relating the second digital output signal and the first digital output signal corresponding to a transfer function of a CT digital-to-analog converter in the second stage and a transfer function of a CT residue amplifier amplifying a residue from the second stage and providing an amplified residue to the first stage.

In Example 14, any one of Examples 8-13 can further include: a dither signal generator to inject a dither signal to an input of a digital-to-analog converter in the second stage.

In Example 15, any one of Examples 8-14 can further include: processing logic to correlate the dither signal with the first digital output signal to estimate the transfer function.

In Example 16, any one of Examples 8-15 can further include: the second digital output signal not contributing to the reconstructed digital output signal.

In Example 17, any one of Examples 8-16 can further include: the first digital filter suppressing a quantization noise of the first stage.

Example 18 is a CT pipeline ADC, the CT pipeline ADC comprising: a first CT converter stage for converting an analog input signal into a first digital output signal and generating a first amplified residue signal; a second CT converter stage for converting the first amplified residue signal into a second digital output signal; and a digital signal reconstruction filter to remove a contribution of a first digital output signal from a reconstructed output, wherein the digital signal reconstruction filter is determined based on a transfer function relating the first digital output signal and the second digital output signal.

In Example 19, Example 18 can further include the digital signal reconstruction filter comprising: a first digital filter to filter the first digital output signal; a second digital filter to filter the second digital output signal; a summer to combine output signals of the first digital filter and the second digital filter; and an equalization filter to filter a result generated by the summer.

In Example 20, Example 18 or 19 can further include the transfer function relating the first digital output signal and the second digital output signal being estimated by injecting a dither signal to an input of a digital-to-analog converter in the first CT converter stage and correlating the dither signal and the second digital output signal.

Example 21 is an apparatus comprising means for implementing and/or carrying out the methods of any one of Examples 1-7 and/or any of the functionalities described herein.

Other Implementation Notes, Variations, and Applications

The following passages are describing an example of digital signal reconstruction for CT pipeline ADC. However, the teachings herein are not limited to CT pipeline ADCs, but other CT multi-stage ADCs as well. The embodiments described herein can be applicable to a variety of converters, including other ADC architectures employing hybrid CT and DT circuit designs (which uses switched-capacitor circuits), etc.

The present architecture for digital signal reconstruction are particularly suitable for high speed, high precision applications where CT pipeline ADCs are used. Applications which can greatly benefit from the architecture include: instrumentation, testing, spectral analyzers, military purposes, radar, wired or wireless communications, mobile telephones (especially because standards continue to push for higher speed communications), and base stations.

In some embodiments, transfer function estimation can be implemented with an on-chip microprocessor (i.e., on-chip with the ADC, executing instructions/firmware provided to the on-chip microprocessor) or by dedicated on-chip digital hardware. In various other embodiments, the digital filters or digital functionalities may be implemented in one or more silicon cores in Application Specific Integrated Circuits (ASICs), Field Programmable Gate Arrays (FPGAs), and other semiconductor architectures.

All of the specifications, dimensions, and relationships outlined herein (e.g., the number of processors, logic operations, etc.) have only been offered for purposes of example and teaching only. Such information may be varied considerably without departing from the spirit of the present disclosure, or the scope of the appended claims. The specifications apply only to one non-limiting example and, accordingly, they should be construed as such. In the foregoing description, example embodiments have been described with reference to particular processor and/or component arrangements. Various modifications and changes may be made to such embodiments without departing from the scope of the present disclosure, appended claims. The description and drawings are, accordingly, to be regarded in an illustrative rather than in a restrictive sense.

Note that with the numerous examples provided herein, interaction may be described in terms of two, three, four, or more electrical components. However, this has been done for purposes of clarity and example only. It should be appreciated that the system can be consolidated in any suitable manner. Along similar design alternatives, any of the illustrated components, modules, and elements of the FIGURES may be combined in various possible configurations, all of which are clearly within the broad scope of this Specification. In certain cases, it may be easier to describe one or more of the functionalities of a given set of flows by only referencing a limited number of electrical elements. It should be appreciated that the electrical circuits of the FIGURES and its teachings are readily scalable and can accommodate a large number of components, as well as more complicated/sophisticated arrangements and configurations. Accordingly, the examples provided should not limit the scope or inhibit the broad teachings of the electrical circuits as potentially applied to a myriad of other architectures.

Note that in this Specification, references to various features (e.g., elements, structures, modules, components, steps, operations, characteristics, etc.) included in "one embodiment", "example embodiment", "an embodiment", "another embodiment", "some embodiments", "various embodiments", "other embodiments", "alternative embodiment", and the like are intended to mean that any such features are included in one or more embodiments of the present disclosure, but may or may not necessarily be combined in the same embodiments.

The functions related to protecting the tunable resistors, such as the processes shown in FIG. 10, illustrate only some of the possible functions that may be executed by, or within, the circuits illustrated in the FIGURES or circuits coupled to the systems illustrated in the FIGURES (e.g., digital circuitry or an on-chip microprocessor). Some of these operations may be deleted or removed where appropriate, or these operations may be modified or changed considerably without departing from the scope of the present disclosure. In addition, the timing of these operations may be altered considerably. The preceding operational flows have been offered for purposes of example and discussion. Substantial flexibility is provided by embodiments described herein in that any suitable arrangements, chronologies, configurations, and timing mechanisms may be provided without departing from the teachings of the present disclosure.

Numerous other changes, substitutions, variations, alterations, and modifications may be ascertained to one skilled in the art and it is intended that the present disclosure encompass all such changes, substitutions, variations, alterations, and modifications as falling within the scope of the disclosure, appended claims. Note that all optional features of the apparatus described above may also be implemented with respect to the method or process described herein and specifics in the examples may be used anywhere in one or more embodiments.

What is claimed is:

1. A method for digital signal reconstruction in a continuous-time (CT) pipeline analog-to-digital converter (ADC), the method comprising:
    filtering a first digital output signal from a first stage of the CT pipeline ADC by a first digital filter to generate a first filtered digital output signal;
    filtering a second digital output signal from a second stage of the CT pipeline ADC by a second digital filter to generate a second filtered digital output signal; and
    summing the first filtered digital output signal and the second filtered digital output signal to generate a reconstructed digital output signal.

2. The method of claim 1, further comprising:
    determining the first digital filter and the second digital filter based on a transfer function relating the first digital output signal and the second digital output signal.

3. The method of claim 1, further comprising:
    injecting a dither signal to an input of a digital-to-analog converter of the first stage; and
    correlating the second digital output signal with the dither signal to estimate a transfer function relating the first digital output signal and the second digital output signal.

4. The method of claim 1, wherein:
    the first digital output signal does not contribute to the reconstructed digital output signal.

5. The method of claim 1, wherein the first digital filter and the second digital filter are finite impulse response filters.

6. The method of claim 1, further comprising:
    filtering a summed signal generated from summing the first filtered digital output signal and the second filtered digital output signal by a digital equalization filter, wherein the digital equalization filter corresponds to an inverse of the first digital filter.

7. The method of claim 6, wherein the digital equalization filter is a finite impulse response filter.

8. A digital signal reconstruction filter for a continuous-time (CT) pipeline analog-to-digital converter (ADC), the digital signal reconstruction filter comprising:
    a first digital filter to filter a first digital output signal from a first stage of the CT pipeline ADC, to generate a first filtered digital output signal, and to remove a contribution of a second digital output signal from a second stage in front of the first stage of the CT pipeline ADC from a reconstructed digital output signal;
    wherein the first digital filter is determined based on a transfer function relating the second digital output signal and the first digital output signal.

9. The digital signal reconstruction filter of claim 8, further comprising:
    a second digital filter to filter the second digital output signal to generate a second filtered digital output signal; and
    a summer to sum the first filtered digital output signal and the second digital output signal to generate the reconstructed digital output signal.

10. The digital signal reconstruction filter of claim 9, further comprising:
    a digital equalization filter to filter a combined signal downstream from the summer to generate the reconstructed digital output signal.

11. The digital signal reconstruction filter of claim 10, wherein at least one of the first digital filter, the second digital filter, and the digital equalization filter is a finite impulse response filter.

12. The digital signal reconstruction filter of claim 10, wherein the first digital filter, the second digital filter, and the digital equalization filter are finite impulse response filters.

13. The digital signal reconstruction filter of claim 8, wherein the transfer function relating the second digital output signal and the first digital output signal corresponds to a transfer function of a CT digital-to-analog converter in the second stage and a transfer function of a CT residue amplifier amplifying a residue from the second stage and providing an amplified residue to the first stage.

14. The digital signal reconstruction filter of claim 8, further comprising:
a dither signal generator to inject a dither signal to an input of a digital-to-analog converter in the second stage.

15. The digital signal reconstruction filter of claim 14, further comprising:
processing logic to correlate the dither signal with the first digital output signal to estimate the transfer function.

16. The digital signal reconstruction filter of claim 8, wherein the second digital output signal does not contribute to the reconstructed digital output signal.

17. The digital signal reconstruction filter of claim 8, wherein the first digital filter suppresses a quantization noise of the first stage.

18. A continuous-time (CT) pipeline analog-to-digital converter (ADC), the CT pipeline ADC comprising:
a first CT converter stage for converting an analog input signal into a first digital output signal and generating a first amplified residue signal;
a second CT converter stage for converting the first amplified residue signal into a second digital output signal; and
a digital signal reconstruction filter to remove a contribution of a first digital output signal from a reconstructed output, wherein the digital signal reconstruction filter is determined based on a transfer function relating the first digital output signal and the second digital output signal.

19. The CT pipeline ADC of claim 18, wherein the digital signal reconstruction filter comprises:
a first digital filter to filter the first digital output signal;
a second digital filter to filter the second digital output signal;
a summer to combine output signals of the first digital filter and the second digital filter; and
an equalization filter to filter a result generated by the summer.

20. The CT pipeline ADC of claim 18, wherein the transfer function relating the first digital output signal and the second digital output signal is estimated by injecting a dither signal to an input of a digital-to-analog converter in the first CT converter stage and correlating the dither signal and the second digital output signal.

* * * * *